United States Patent
Feng et al.

(10) Patent No.: US 10,762,817 B2
(45) Date of Patent: Sep. 1, 2020

(54) GATE DRIVING CIRCUIT, DRIVING METHOD AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Bo Feng, Beijing (CN); Shijun Wang, Beijing (CN); Xi Chen, Beijing (CN); Hongming Zhan, Beijing (CN)

(73) Assignees: BEIJING BOE DISPLAY TECHNOLOGU CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 182 days.

(21) Appl. No.: 16/108,714

(22) Filed: Aug. 22, 2018

(65) Prior Publication Data
US 2019/0236994 A1 Aug. 1, 2019

(30) Foreign Application Priority Data
Jan. 26, 2018 (CN) .......................... 2018 1 0076783

(51) Int. Cl.
| | |
|---|---|
| G11C 19/00 | (2006.01) |
| G09G 3/20 | (2006.01) |
| G11C 19/28 | (2006.01) |
| G09G 3/36 | (2006.01) |

(52) U.S. Cl.
CPC ............. *G09G 3/20* (2013.01); *G09G 3/3677* (2013.01); *G09G 2300/0809* (2013.01); *G09G 2310/0286* (2013.01); *G09G 2310/08* (2013.01); *G09G 2330/021* (2013.01); *G11C 19/28* (2013.01); *G11C 19/287* (2013.01)

(58) Field of Classification Search
None
See application file for complete search history.

(56) References Cited

U.S. PATENT DOCUMENTS

| | | | |
|---|---|---|---|
| 2014/0159999 A1* | 6/2014 | Gu .......................... | G11C 19/28 345/100 |
| 2016/0027526 A1* | 1/2016 | Xu .......................... | G11C 19/28 345/215 |
| 2017/0270851 A1* | 9/2017 | Shang ..................... | G11C 19/28 |
| 2018/0204494 A1* | 7/2018 | Shang ..................... | G11C 19/28 |
| 2019/0066562 A1* | 2/2019 | Hu ............................ | G09G 3/20 |
| 2019/0114952 A1* | 4/2019 | Li ............................. | G09G 3/20 |
| 2019/0236995 A1* | 8/2019 | Du ........................... | G09G 3/20 |

* cited by examiner

Primary Examiner — Tuan T Lam
(74) Attorney, Agent, or Firm — Dinsmore & Shohl LLP

(57) ABSTRACT

The present disclosure provides a gate driving circuit, a driving method, and a display device. The gate driving circuit includes cascaded multistage gate driving units and a reset adjustment unit. Each stage of the gate driving units includes a pull-up module, a first output module, a second output module, and a reset module. The reset adjustment unit is used for, under the control of a first and a second control signal, inputting the reset signal of the reset terminal of a former stage gate driving unit to the reset module of a latter stage gate driving unit, and inputting the reset signal of the reset terminal of the latter stage gate driving unit to the reset module of the former stage gate driving unit.

19 Claims, 5 Drawing Sheets

GATE DRIVING CIRCUIT, DRIVING METHOD AND DISPLAY DEVICE

CROSS-REFERENCE TO RELATED APPLICATIONS

The present application claims priority to China Patent Application No. 201810076783.X filed on Jan. 26, 2018, the disclosure of which is incorporated by reference herein in its entirety.

TECHNICAL FIELD

The present disclosure relates to a gate driving circuit, a driving method, and a display device.

BACKGROUND

With the continuous improvement of energy consumption standards, reducing power consumption has become an important development direction of displays such as TFT-LCD (thin film transistor-liquid crystal display).

According to related art, display power consumption is mainly reduced by changing polarity inversion manner of data signals. For example, display power consumption can be reduced by changing a dot inversion manner to a column inversion manner or a row inversion manner.

SUMMARY

According to one aspect of embodiments of the present disclosure, a gate driving circuit is provided. The gate driving circuit comprises cascaded multistage gate driving units and a reset adjustment unit. Each stage of the gate driving units comprises: a pull-up module for pulling up a potential of a pull-up node under the control of an input signal; a first output module for pulling up the potential of the pull-up node under the control of a clock signal and outputting the clock signal to a first output terminal; a second output module for outputting a gate driving signal to a second output terminal in a case where the potential of the pull-up node is pulled up by the first output module; and a reset module for pulling down potentials of the pull-up node, the first output terminal and the second output terminal under the control of a reset signal from a reset terminal. The reset adjustment unit is used for, under the control of a first control signal and a second control signal, inputting the reset signal of the reset terminal of a former stage gate driving unit to the reset module of a latter stage gate driving unit, and inputting the reset signal of the reset terminal of the latter stage gate driving unit to the reset module of the former stage gate driving unit, wherein the former stage gate driving unit and the latter stage gate driving unit are two cascaded gate driving units of the gate driving units.

In some embodiments, the reset adjustment unit is further used for, under the control of the first control signal and the second control signal, inputting the reset signal of the reset terminal of the former stage gate driving unit to the reset module of the former stage gate driving unit, and inputting the reset signal of the reset terminal of the latter stage gate driving unit to the reset module of the latter stage gate driving unit.

In some embodiments, the reset adjustment unit comprises: a first transistor, of which a gate electrode is used for receiving the first control signal, a first electrode is connected to the reset terminal of the former stage gate driving unit, and a second electrode is connected to the reset module of the latter stage gate driving unit; a second transistor, of which a gate electrode is used for receiving the first control signal, a first electrode is connected to the reset terminal of the latter stage gate driving unit, and a second electrode is connected to the reset module of the former stage gate driving unit; a third transistor, of which a gate electrode is used for receiving the second control signal, a first electrode is connected to the reset terminal of the former stage gate driving unit, and a second electrode is connected to the reset module of the former stage gate driving unit; and a fourth transistor, of which a gate electrode is used for receiving the second control signal, a first electrode is connected to the reset terminal of the latter stage gate driving unit, and a second electrode is connected to the reset module of the latter stage gate driving unit.

In some embodiments, channels of the first transistor, the second transistor, the third transistor, and the fourth transistor have the same conductivity type; and the first control signal and the second control signal have opposite logic levels.

In some embodiments, channels of the first transistor and the second transistor have a first conductivity type, and channels of the third transistor and the fourth transistor have a second conductivity type different from the first conductivity type; and the first control signal and the second control signal have the same logic level.

In some embodiments, the first control signal is the same as the second control signal.

In some embodiments, the pull-up module comprises a fifth transistor, of which a gate electrode is used for receiving the input signal, a first electrode is connected to a first voltage terminal, and a second electrode is connected to the pull-up node.

In some embodiments, the first output module comprises: a sixth transistor, of which a gate electrode is connected to the pull-up node, a first electrode is used for receiving the clock signal, and electrode is connected to the first output terminal; and a capacitor, of which a first end of the capacitor is connected to the pull-up node, and a second end of the capacitor is connected to the first output terminal.

In some embodiments, the second output module comprises a seventh transistor, of which a gate electrode is connected to the pull-up node, a first electrode is used for receiving the gate driving signal, and a second electrode is connected to the second output terminal.

In some embodiments, the reset module comprises: a eighth transistor, of which a gate electrode is connected to the reset adjustment unit, a first electrode is connected to the pull-up node, and a second electrode is connected to a second voltage terminal; and a ninth transistor, of which a gate electrode is connected to the reset adjustment unit, a first electrode is connected to the second output terminal, and a second electrode is connected to the second voltage terminal.

In some embodiments, the reset module further comprises: a first control submodule for pulling up a potential of a first pull-down node in a case where the potential of the pull-up node is pulled down; and a first holding submodule for pulling down potentials of the pull-up node, the first output terminal and the second output terminal in a case where the potential of the first pull-down node is pulled up.

In some embodiments, the reset module further comprises: a second control submodule for pulling up a potential of a second pull-down node in a case where the potential of the pull-up node is pulled down; and a second holding submodule for pulling down potentials of the pull-up node, the first output terminal and the second output terminal in a case where the potential of the second pull-down node is pulled up.

According to another aspect of embodiments of the present disclosure, a display device which comprises the gate driving circuit provided by any embodiment of the present disclosure is provided.

According to still another aspect of embodiments of the present disclosure, a driving method for the gate driving circuit provided by any embodiment of the present disclosure is provided. The driving method comprises: under the control of the first control signal and the second control signal, inputting the reset signal from the reset terminal of the former stage gate driving unit to the reset module of the latter stage gate driving unit, and inputting the reset signal from the reset terminal of the latter stage gate driving unit to the reset module of the former stage gate driving unit.

In some embodiments, the driving method further comprising: under the control of the first control signal and the second control signal, inputting the reset signal of the reset terminal of the former stage gate driving unit to the reset module of the former stage gate driving unit, and inputting the reset signal of the reset terminal of the latter stage gate driving unit to the reset module of the latter stage gate driving unit.

In some embodiments, the reset adjustment unit comprises: a first transistor, of which a gate electrode is used for receiving the first control signal, a first electrode is connected to the reset terminal of the former stage gate driving unit, and a second electrode is connected to the reset module of the latter stage gate driving unit; a second transistor, of which a gate electrode is used for receiving the first control signal, a first electrode is connected to the reset terminal of the latter stage gate driving unit, and a second electrode is connected to the reset module of the former stage gate driving unit; a third transistor, of which a gate electrode is used for receiving the second control signal, a first electrode is connected to the reset terminal of the former stage gate driving unit, and a second electrode is connected to the reset module of the former stage gate driving unit; and a fourth transistor, of which a gate electrode is used for receiving the second control signal, a first electrode is connected to the reset terminal of the latter stage gate driving unit, and a second electrode is connected to the reset module of the latter stage gate driving unit.

In some embodiments, channels of the first transistor, the second transistor, the third transistor, and the fourth transistor have the same conductivity type; and the first control signal and the second control signal have opposite logic levels.

In some embodiments, channels of the first transistor and the second transistor have a first conductivity type, and channels of the third transistor and the fourth transistor have a second conductivity type different from the first conductivity type; and the first control signal and the second control signal have the same logic level.

In some embodiments, the first control signal is the same as the second control signal.

Other features, aspects and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure, in which.

Figure 1:
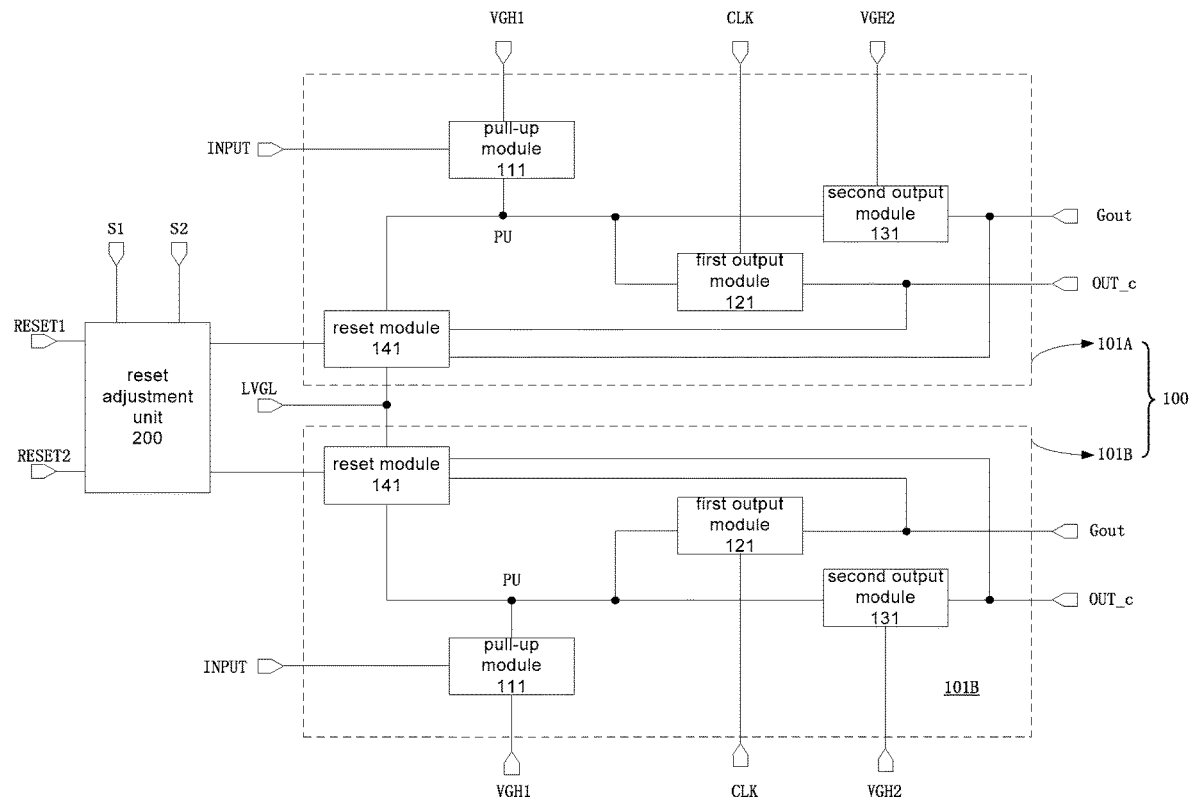
FIG. 1 is a schematic structural view showing a gate driving circuit according to some embodiments of the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art.

It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the related art, the method of reducing display power consumption by changing a dot inversion manner to a column inversion manner or a row inversion manner may cause display flickering and other issues, thereby affecting the display effect of the display.

In view of the above issue, a gate driving circuit which may reduce display power consumption without affecting the display effect is provided according to embodiments of the present disclosure.

FIG. 1 is a schematic structural view showing a gate driving circuit according to some embodiments of the present disclosure. As shown in FIG. 1, the gate driving circuit may comprise cascaded multistage gate driving units 100 and a reset adjustment unit 200. Here, FIG. 1 only schematically shows any two cascaded gate driving units, that is, a gate driving unit 101A and a gate driving unit 101B.

In the following description, the gate driving unit 101A may also be referred to as a former stage gate driving unit (a gate driving unit in a former stage), and the gate driving unit 101B may also be referred to as a latter stage gate driving unit (a gate driving unit in a latter stage). The former stage gate driving unit and the latter stage gate driving unit sequentially start to output a gate driving signal to a corresponding gate line.

Referring to FIG. 1, each stage gate driving unit may comprise a pull-up module 111, a first output module 121, a second output module 131, and a reset module 141.

The functions of various modules will be described below by taking the first gate driving unit 101A as an example.

The pull-up module 111 is connected to a signal input terminal INPUT, a pull-up node PU and a first voltage terminal VGH1. The pull-up module 111 is used for pulling up the potential of the pull-up node PU, for example, to a high potential of the first voltage terminal VGH1, under the control of an input signal of a signal input terminal INPUT.

The first output module 121 is connected to the pull-up node PU, a clock signal terminal CLK and a first output terminal OUT_c. The first output module 121 is used for pulling up the potential of the pull-up node PU under the control of a clock signal of the clock signal terminal CLK, and outputting the clock signal to the first output terminal OUT_c. It can be understood that the potential of the pull-up node PU can be further pulled up by the first output module 121 after being pulled up by the pull-up module 111.

The second output module 131 is connected to the pull-up node PU, a gate driving signal terminal VGH2 and a second output terminal Gout. The second output module 131 is used for outputting a gate driving signal of the gate driving signal terminal VGH2 to the second output terminal Gout in the case where the potential of the pull-up node PU is pulled up by the first output module 121.

The reset module 141 is connected to the pull-up node PU, the first output terminal OUT_c and the second output terminal Gout. The reset module 141 is used for pulling down the potentials of the pull-up node PU, the first output terminal OUT_c and the second output terminal Gout, for example, to a low potential of a second voltage terminal LVGL, under the control of a reset signal from the reset terminal RESET1.

Reference can be made to the above description for the functions of various modules of the second gate driving unit 101B, except that the reset module 141 is used for pulling down the potentials of the pull-up node PU, the first output terminal OUT_c and the second output terminal Gout under the control of a reset signal from a reset terminal RESET2.

The reset adjustment unit 200 is used for, under the control of a first control signal S1 and a second control signal S2, inputting the reset signal of the reset terminal RESET1 of the former stage gate driving unit 101A to the reset module 141 of the latter stage gate driving unit 101B, and inputting the reset signal of the reset terminal RESET2 of the latter stage gate driving unit 101B to the reset module 141 of the former stage gate driving unit 101A.

In general, the reset signal of the reset terminal RESET1 is used for resetting the former stage gate driving unit 101A, and the reset signal of the reset terminal RESET2 is used for resetting the latter stage gate driving unit 101B, that is, the former stage gate driving unit 101A is reset earlier than the latter stage gate driving unit 101B, thereby realizing a normal output of gate driving signals.

For example, it is assumed that time t1 is earlier than time t2, time t2 is earlier than time t3, and time t3 is earlier than time t4 in one image frame. At time t1, the former stage gate driving unit 101A starts to output a gate driving signal G1; at time t2, the latter stage gate driving unit 101B starts to output a gate driving signal G2; at time t3, the former stage gate driving unit 101A stops outputting the gate driving signal G1; and at time t4, the latter stage gate driving unit 101B stops outputting the gate driving signal G2.

By setting the reset adjustment unit 200, the reset signal of the reset terminal RESET1 can be used to reset the latter stage gate driving unit 101B, and the reset signal of the reset terminal RESET2 can be used to reset the former stage gate driving unit 101A, which makes the order in which two cascaded gate driving units are reset invert, thereby achieving a shifting output of gate driving signals.

For example, at time t1, the former stage gate driving unit 101A starts to output the gate driving signal G1; at time t2, the latter stage gate driving unit 101B starts to output a gate driving signal G2; at time t3, the latter stage gate driving unit 101B stops outputting the gate driving signal G2; and at time t4, the former stage gate driving unit 101A stops outputting the gate driving signal G1.

It can be seen that, in the normal output mode, the former stage gate driving unit 101A is reset at time t3, and the latter stage gate driving unit 101B is reset at time t4. While, in the shifting output mode, the latter stage gate driving unit 101B is reset at time t3, and the former stage gate driving unit 101A is reset at time t4. That is to say, compared to the normal output mode, the order in which two cascaded gate driving units are reset is inverted in the shifting output mode.

It should be noted that, in practical applications, a corresponding reset adjustment unit 200 may be provided for two stages of gate driving units which need to implement a shifting output.

In the above embodiments, the reset adjustment unit can control the order in which two cascaded gate driving units are reset invert, which can reduce the number of times the polarities of data signals are changed in the dot inversion manner, so that display power consumption can be reduced without affecting the display effect.

In some embodiments, the reset adjustment unit 200 is further used for, under the control of the first control signal S1 and the second control signal S2, inputting the reset signal of the reset terminal RESET1 of the former stage gate driving unit 101A to the reset module 141 of the former stage gate driving unit 101A, and inputting the reset signal of the reset terminal RESET2 of the latter stage gate driving unit 101B to the reset module 141 of the latter stage gate driving unit 101B, so as to implement a normal output. In this way, switching between a normal output and a shifting output of gate driving signals can realized by the reset adjustment unit 200 under the control of the first control signal S1 and the second control signal S2.

Figure 2:
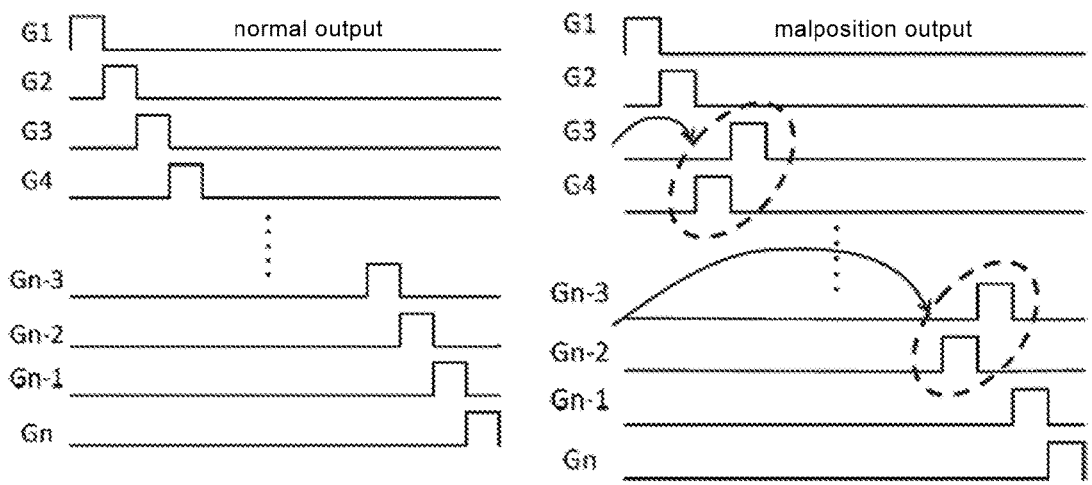
FIG. 2 is a schematic view showing gate driving signals output according to some embodiments of the present disclosure.

FIG. 2 is a schematic view showing gate driving signals output according to some embodiments of the present disclosure. It should be noted that each gate driving signal shown in FIG. 2 is a gate driving signal corresponding to a period in which a data signal of a desired polarity is applied, and the gate driving signal corresponding to a period in which a data signal of an undesired polarity is applied is not shown.

In the normal output mode, the gate driving units in various stages sequentially output gate driving signals Gn to corresponding gate lines, that is, sequentially output G1, G2, G3, . . . , Gn–1 and Gn. Correspondingly, for example, the polarity of a data signal applied to the first column of pixels is sequentially inverted in a dot inversion manner, that is, positive (+), negative (−), positive (+), and negative (−) . . . .

In the shifting output mode, the first stage gate driving unit and the second stage gate driving unit sequentially output gate driving signals G1 and G2. For the third stage gate driving unit and the fourth stage gate driving unit, the output ending times of the gate driving signals G3 and G4 can be controlled by the reset adjustment unit so that the output end time of G4 is earlier than the output end time of G3. In this way, the time at which a data signal of a desired polarity (−) is applied to a pixel corresponding to G4 of the first column of pixels may be earlier than the time at which a data signal of a desired polarity (+) is applied to a pixel corresponding to G3 of the first column of pixels. That is to say, the polarities of the data signals applied to the first column of pixels can be inverted in the following manner: positive (+), negative (−), negative (−), and positive (+) . . . .

It can be known from the above analysis that, in the shifting output mode, the number of times the polarities of data signals are changed in the dot inversion manner can be reduced, so that display power consumption can be reduced without affecting the display effect.

Further, in the shifting output mode, similar to the dot inversion manner, the number of times the polarities of data signals are changed in the row inversion manner can also be reduced, so that display power consumption can be further reduced in the row inversion manner.

Figure 3:
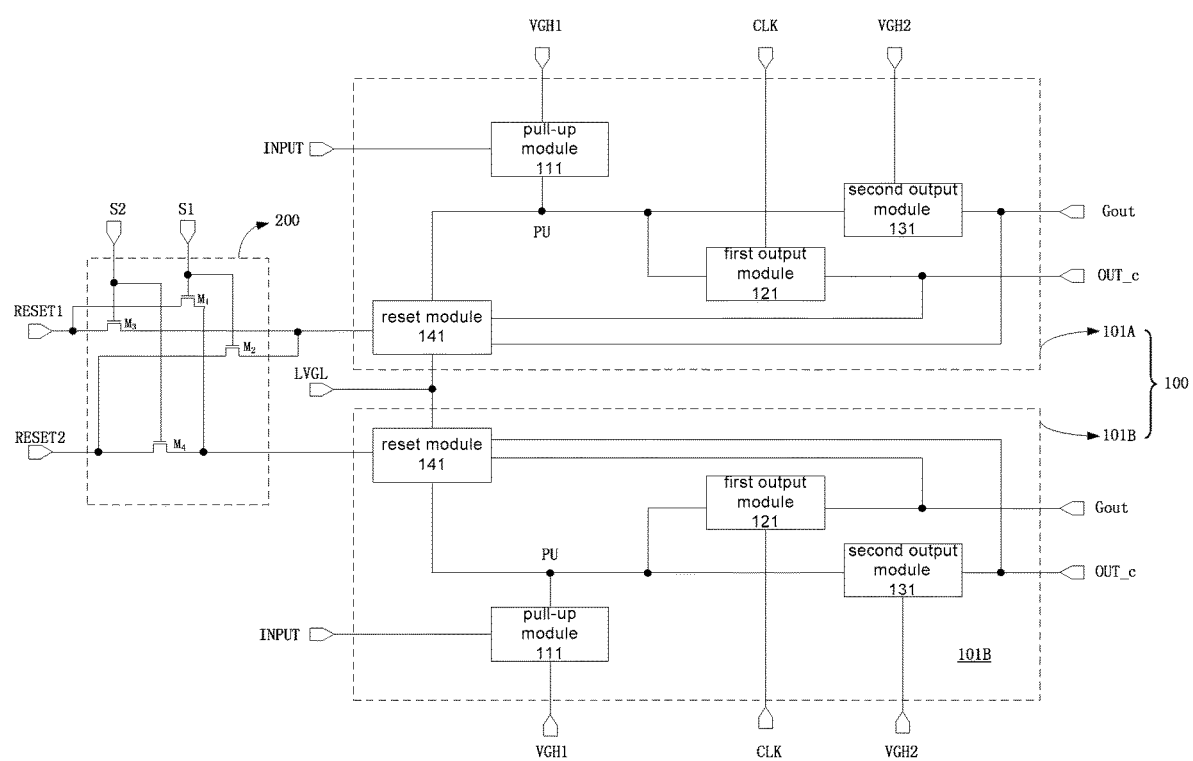
FIG. 3 is a schematic structural view showing a gate driving circuit according to other embodiments of the present disclosure.

FIG. 3 is a schematic structural view showing a gate driving circuit according to other embodiments of the present disclosure. As shown in FIG. 3, the reset adjustment unit 200 may comprise a first transistor M1, a second transistor M2, a third transistor M3, and a fourth transistor M4.

The gate electrode of the first transistor M1 is used for receiving the first control signal S1, a first electrode of the first transistor M1 is connected to the reset terminal RESET 1 of the former stage gate driving unit 101A, and a second electrode of the first transistor M1 is connected to the reset module 141 of the latter stage gate driving unit 101B. The gate electrode of the second transistor M2 is used for receiving the first control signal S1, a first electrode of the second transistor M2 is connected to the reset terminal RESET 2 of the latter stage gate driving unit 101B, and a second electrode of the second transistor M2 is connected to the reset module 141 of the former stage gate driving unit 101A. The gate electrode of the third transistor M3 is used for receiving the second control signal S2, a first electrode of the third transistor M3 is connected to the reset terminal RESET 1 of the former stage gate driving unit 101A, and a second electrode of the third transistor M3 is connected to the reset module 141 of the former stage gate driving unit 101A. The gate electrode of the fourth transistor M4 is used for receiving the second control signal S2, a first electrode of the fourth transistor M4 is connected to the reset terminal RESET 2 of the latter stage gate driving unit 101B, and a second electrode of the fourth transistor M4 is connected to the reset module 141 of the latter stage gate driving unit 101B.

In some embodiments, channels of the first transistor M1, the second transistor M2, the third transistor M3, and the fourth transistor M4 have the same conductivity type. For example, the first transistor M1, the second transistor M2, the third transistor M3, and the fourth transistor M4 are all NMOS (N-Metal-Oxide-Semiconductor) transistors. In another example, the first transistor M1, the second transistor M2, the third transistor M3, and the fourth transistor M4 are all PMOS (P-Metal-Oxide-Semiconductor) transistors.

In this case, the logic levels of the first control signal and the second control signal are opposite, that is, one of the first control signal and the second control signal is at a high level, and the other is at a low level.

Below, the working principle of the reset adjustment unit 200 will be explained with an example in which the first transistor M1, the second transistor M2, the third transistor M3, and the fourth transistor M4 are NMOS transistors.

In a case where the first control signal S1 is at a high level and the second control signal S2 is at a low level, the first transistor M1 and the second transistor M2 are turned on, and the third transistor M3 and the fourth transistor M4 are turned off, so that a reset signal from the reset terminal RESET1 of the former stage gate driving unit 101A may be input to the reset module 141 of the latter stage gate driving unit 101B, and a reset signal from the reset terminal RESET2 of the latter stage gate driving unit 101B may be input to the reset module 141 of the former stage gate driving unit 101A.

In a case where the first control signal S1 is at a low level and the second control signal S2 is at a high level, the first transistor M1 and the second transistor M2 are turned off, and the third transistor M3 and the fourth transistor M4 are turned on, so that a reset signal from the reset terminal RESET1 of the former stage gate driving unit 101A may be input to the reset module 141 of the former stage gate driving unit 101A, and a reset signal from the reset terminal RESET2 of the latter stage gate driving unit 101B may be input to the reset module 141 of the latter stage gate driving unit 101B.

In other embodiments, the channels of the first transistor M1 and the second transistor M2 have a first conductivity type, and the channels of the third transistor M3 and the fourth transistor M4 have a second conductivity type different from the first conductivity type. For example, the first transistor M1 and the second transistor M2 may be NMOS transistors, that is, channels of the first transistor M1 and the second transistor M2 have a N-type conductivity; the third transistor M3 and the fourth transistor M4 may be PMOS transistors, that is, channels of the third transistor M3 and the fourth transistor M4 have a P-type conductivity. As another example, the first transistor M1 and the second transistor M2 each may be a PMOS transistor, and the third transistor M3 and the fourth transistor M4 each may be a NMOS transistors.

In this case, the logic levels of the first control signal and the second control signal are the same, that is, both are high or low. In some embodiments, the first control signal and the second control signal can be the same, i.e., they can be the same one control signal.

Below, the working principle of the reset adjustment unit 200 will be explained with an example in which the first transistor M1 and the second transistor M2 are NMOS transistors, the third transistor M3 and the fourth transistor M4 are PMOS transistors.

In a case where the first control signal S1 and the second control signal S2 are both at a high level, the first transistor M1 and the second transistor M2 are turned on, and the third transistor M3 and the fourth transistor M4 are turned off, so that a reset signal from the reset terminal RESET1 of the former stage gate driving unit 101A may be input to the reset module 141 of the latter stage gate driving unit 101B, and a reset signal from the reset terminal RESET2 of the latter stage gate driving unit 101B may be input to the reset module 141 of the former stage gate driving unit 101A.

In a case where the first control signal S1 and the second control signal S2 are both at a low level, the first transistor M1 and the second transistor M2 are turned off, and the third transistor M3 and the fourth transistor M4 are turned on, so that a reset signal from the reset terminal RESET1 of the former stage gate driving unit 101A may be input to the reset module 141 of the former stage gate driving unit 101A, and a reset signal from the reset terminal RESET2 of the latter stage gate driving unit 101B may be input to the reset module 141 of the latter stage gate driving unit 101B.

It should be understood that the first transistor M1, the second transistor M2, the third transistor M3, and the fourth transistor M4 may not be limited to MOS transistors in still other embodiments.

Figure 4:
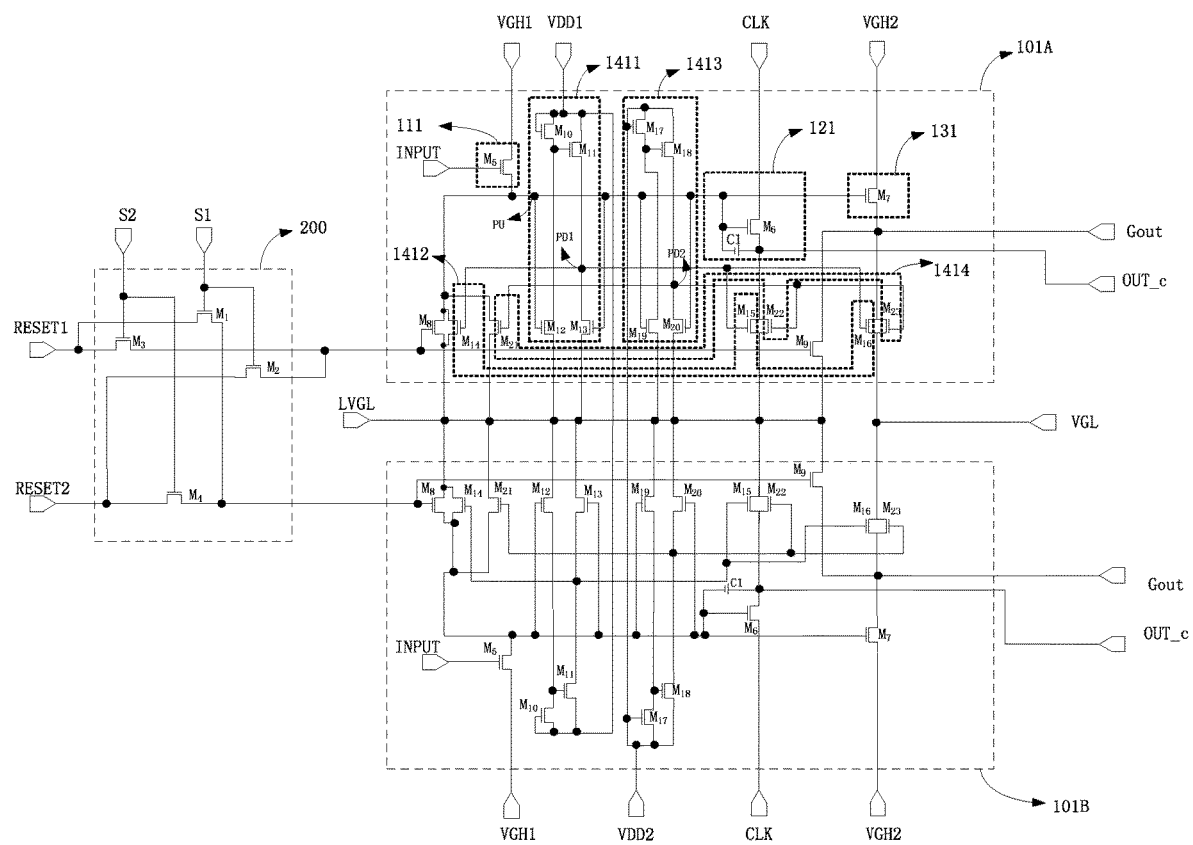
FIG. 4 is a schematic structural view showing a gate driving circuit according to still other embodiments of the present disclosure.

FIG. 4 is a schematic structural view showing a gate driving circuit according to still other embodiments of the present disclosure.

Implementations of the pull-up module 111, the first output module 121, the second output module 131, and the reset module 141 will be described below with reference to FIG. 4. It should be understood by those skilled in the art that the various modules of the gate driving unit are not necessarily all implemented as the specific implementations shown in FIG. 4.

The pull-up module 111 may comprise a fifth transistor M5. The gate electrode of the fifth transistor M5 is used for receiving an input signal from the signal input terminal INPUT, a first electrode of the fifth transistor M5 is connected to the first voltage terminal VGH1, and a second electrode of the fifth transistor M5 is connected to the pull-up node PU.

The first output module 121 may comprise a sixth transistor M6 and a capacitor C1. The gate electrode of the sixth transistor M6 is connected to the pull-up node PU, a first electrode of the sixth transistor M6 is used for receiving a clock signal from the clock signal terminal CLK, and a second electrode of the sixth transistor M6 is connected to the first output terminal OUT_c. A first end of the capacitor C1 is connected to the pull-up node PU, and a second end of the capacitor C1 is connected to the first output terminal OUT_c.

The second output module 131 may comprise a seventh transistor M7. The gate electrode of the seventh transistor M7 is connected to the pull-up node PU, a first electrode of the seventh transistor M7 is used for receiving a gate driving signal from the gate driving signal terminal VGH2, and a second electrode of the seventh transistor M7 is connected to the second output terminal Gout.

The reset module 141 may comprise an eighth transistor M8 and a ninth transistor M9. The gate electrode of the eighth transistor M8 is connected to the reset adjustment unit 200 (for example, the second electrode of the second transistor M2), a first electrode of the eighth transistor M8 is connected to the pull-up node PU, and the second electrode of the eighth transistor M8 is connected to the second voltage terminal LVGL. The gate electrode of the ninth transistor M9 is connected to the reset adjustment unit 200 (for example, the second electrode of the second transistor M2), a first electrode of the ninth transistor M9 is connected to the second output terminal Gout, and a second electrode of the ninth transistor M9 is connected to the second voltage terminal LVGL.

In some implementations, the reset module 141 may further comprise a first control submodule 1411 and a first holding submodule 1412. The first control submodule 1411 is used for pulling up the potential of a first pull-down node PD1 in the case where the potential of the pull-up node PU is pulled down; and pulling down the potential of the first pull-down node PD1 in the case where the potential of the pull-up node PU is pulled up. The first holding submodule 1412 is used for pulling down the potentials of the pull-up node PU, the first output terminal OUT_c and the second output terminal Gout (for example, pulling down the potentials of the pull node PU, the first output terminal OUT_c to a low potential of the second voltage terminal LVGL, and pulling down the potential of the second output terminal Gout to a low potential of the third voltage terminal VGL) in the case where the potential of the first pull-down node PD1 is pulled up.

In the case where the first control submodule 1411 and the first holding submodule 1412 are abnormal, in order to ensure that the gate driving circuit can still operate normally, the reset module 141 may further comprise a backup second control submodule 1413 and a backup second holding submodule 1414. The second control submodule 1413 is used for pulling up a potential of the second pull-down node PD2 in the case where the potential of the pull-up node PU is pulled down; and pulling down the potential of the second pull-down node PD2 in the case where the potential of the pull-up node PU is pulled up. The second holding submodule 1414 is used for pulling down the potentials of the pull-up node PU, the first output terminal OUT_c, and the second output terminal Gout in the case where the potential of the second pull-down node PD2 is pulled up.

The implementations of the first control submodule 1411, the first holding submodule 1412, the second control submodule 1413, and the second holding submodule 1414 will be described below with reference to FIG. 4.

Referring to FIG. 4, the first control submodule 1411 may comprise a tenth transistor M10, an eleventh transistor M11, a twelfth transistor M12, and a thirteenth transistor M13. The gate electrode and a first electrode of the tenth transistor M10 are connected to a fourth voltage terminal VDD1, and a second electrode of the tenth transistor M10 is connected to the gate electrode of the eleventh transistor M11. A first electrode of the eleventh transistor M11 is connected to the fourth voltage terminal VDD1, and a second electrode of the eleventh transistor M11 is connected to the first pull-down node PD1. The gate electrode of the twelfth transistor M12 is connected to the pull-up node PU, a first electrode of the twelfth transistor M12 is connected to the second electrode of the tenth transistor M10, and a second electrode of the twelfth transistor M12 is connected to the second voltage terminal LVGL. The gate electrode of the thirteenth transistor M13 is connected to the pull-up node PU, a first electrode of the thirteenth transistor M13 is connected to the first pull-down node PD1, and a second electrode of the thirteenth transistor M13 is connected to the second voltage terminal LVGL.

The first holding submodule 1412 may comprise a fourteenth transistor M14, a fifteenth transistor M15, and a sixteenth transistor M16. The gate electrode of the fourteenth transistor M14 is connected to the first pull-down node PD1, a first electrode of the fourteenth transistor M14 is connected to the pull-up node PU, and a second electrode of the fourteenth transistor M14 is connected to the second voltage terminal LVGL. The gate electrode of the fifteenth transistor M15 is connected to the first pull-down node PD1, a first electrode of the fifteenth transistor M15 is connected to the first output terminal OUT_c, and a second electrode of the fifteenth transistor M15 is connected to the second voltage terminal LVGL. The gate electrode of the sixteenth transistor M16 is connected to the first pull-down node PD1, a first electrode of the sixteenth transistor M16 is connected to the second output terminal Gout, and a second electrode of the sixteenth transistor M16 is connected to the third voltage terminal VGL.

The second control submodule 1413 may comprise a seventeenth transistor M17, an eighteenth transistor M18, a nineteenth transistor M19, and a twentieth transistor M20. The gate electrode and a first electrode of the seventeenth transistor M17 are connected to a fifth voltage terminal VDD2, and a second electrode of the seventeenth transistor M17 is connected to the gate electrode of the eighteenth transistor M18. A first electrode of the eighteenth transistor M18 is connected to the fifth voltage terminal VDD2, and a second electrode of the eighteenth transistor M18 is connected to the second pull-down node PD2. The gate electrode of the nineteenth transistor M19 is connected to the pull-up node PU, a first electrode of the nineteenth transistor M19 is connected to the second electrode of the seventeenth transistor M17, and a second electrode of the nineteenth transistor M19 is connected to the second voltage terminal LVGL. The gate electrode of the twentieth transistor M20 is connected to the pull-up node PU, a first electrode of the twentieth transistor M20 is connected to the second pull-down node PD2, and a second electrode of the twentieth transistor M20 is connected to the second voltage terminal LVGL.

The second holding submodule 1414 may comprise a twenty-first transistor M21, a twenty-second transistor M22, and a twenty-third transistor M23. The gate electrode of the twenty-first transistor M21 is connected to the second pull-down node PD2, a first electrode of the twenty-first transistor M21 is connected to the pull-up node PU, and a second electrode of the twenty-first transistor M21 is connected to the second voltage terminal LVGL. The gate electrode of the twenty-second transistor M22 is connected to the second pull-down node PD2, a first electrode of the twenty-second transistor M22 is connected to the first output terminal OUT_c, and a second electrode of the twenty-second transistor M22 is connected to the second voltage terminal LVGL. The gate electrode of the twenty-third transistor M23 is connected to the second pull-down node PD2, a first electrode of the twenty-third transistor M23 is connected to the second output terminal Gout, and a second electrode of the twenty-third transistor M23 is connected to the third voltage terminal VGL.

By controlling the potentials of the fourth voltage terminal VDD1 and the fifth voltage terminal VDD2, the first control submodule and the first holding submodule can be controlled to work, and the second control submodule and the second holding submodule can be controlled to not work; or the first control submodule and the first holding submodule can be controlled to not work and the second control submodule and the second holding submodule are controlled to work. For example, the potentials of the fourth voltage terminal VDD1 and the fifth voltage terminal VDD2 may be changed at predetermined intervals, thereby realizing switching of the working states of the two sets of control submodules and holding submodules.

The operation of each stage gate driving unit will be described below with reference to FIG. 4 taking the gate driving unit 101A as an example.

In a first stage, the input signal of the signal input terminal INPUT is at a low level, the potential of the pull-up node PU is low, and the first output terminal OUT_c and the second output terminal Gout have no output.

In a second stage, the input signal of the signal input terminal INPUT is at a high level, the clock signal of the clock signal terminal CLK is at a low level, and the reset signal of the reset terminal RESET1 is at a low level. In this case, the fifth transistor M5 is turned on, the potential of the pull-up node PU is pulled up, the sixth transistor M6 and the seventh transistor M7 are turned on, the first output terminal OUT_c outputs a low-level clock signal, and the second output terminal Gout outputs a high level gate driving signal. In addition, the signal of the fourth voltage terminal VDD1 is at a high level, the tenth transistor M10 and the eleventh transistor M11 are turned on, the twelfth transistor M12 and the thirteenth transistor M13 are turned on under the control of the pull-up node PU, thereby pulling down the potential of the first pull-down node PD1 to a low potential of the second voltage terminal LVGL.

In a third stage, the input signal of the signal input terminal INPUT is at a high level, the clock signal of the clock signal terminal CLK is at a high level, and the reset signal of the reset terminal RESET1 is at a low level. In this case, under the action of the capacitor C1, the potential of the pull-up node PU is further pulled up, the first output terminal OUT_c outputs a high-level clock signal, and the second output terminal Gout outputs a gate driving signal. The other transistors maintain the state of the first stage.

In a fourth stage, the potential of the reset signal of the reset terminal RESET1 becomes a high level, and the second transistor M2 and the ninth transistor M9 are turned on, thereby pulling down the potentials of the pull-up node PU and the first output terminal OUT_c to the potential of the second voltage terminal LVGL. In the case where the potential of the pull-up node PU is pulled down, the twelfth transistor M12 and the thirteenth transistor M13 are turned off, thereby pulling up the potential of the first pull-down node PD1 to a high potential of the fourth voltage terminal VDD1. The fourteenth transistor M14, the fifteenth transistor M15, and the sixteenth transistor M16 are turned on in the case where the potential of the first pull-down node PD1 is pulled up, thereby pulling down the potentials of the pull-up node PU and the first output terminal OUT_c to the low potential of the second voltage terminal LVGL, and pulling down the potential of the second output terminal Gout to the low potential of the third voltage terminal VGL.

Returning to the first stage, neither the first output terminal OUT_c nor the second output terminal Gout has an output until a next image frame.

In the gate driving circuit, a group of gate driving units may be formed by M gate driving units, wherein M is an even number greater than or equal to 4. The relationship between various gate driving units will be introduced below with reference to FIG. 5 taking each group of gate driving units including six cascaded gate driving units as an example.

Figure 5:
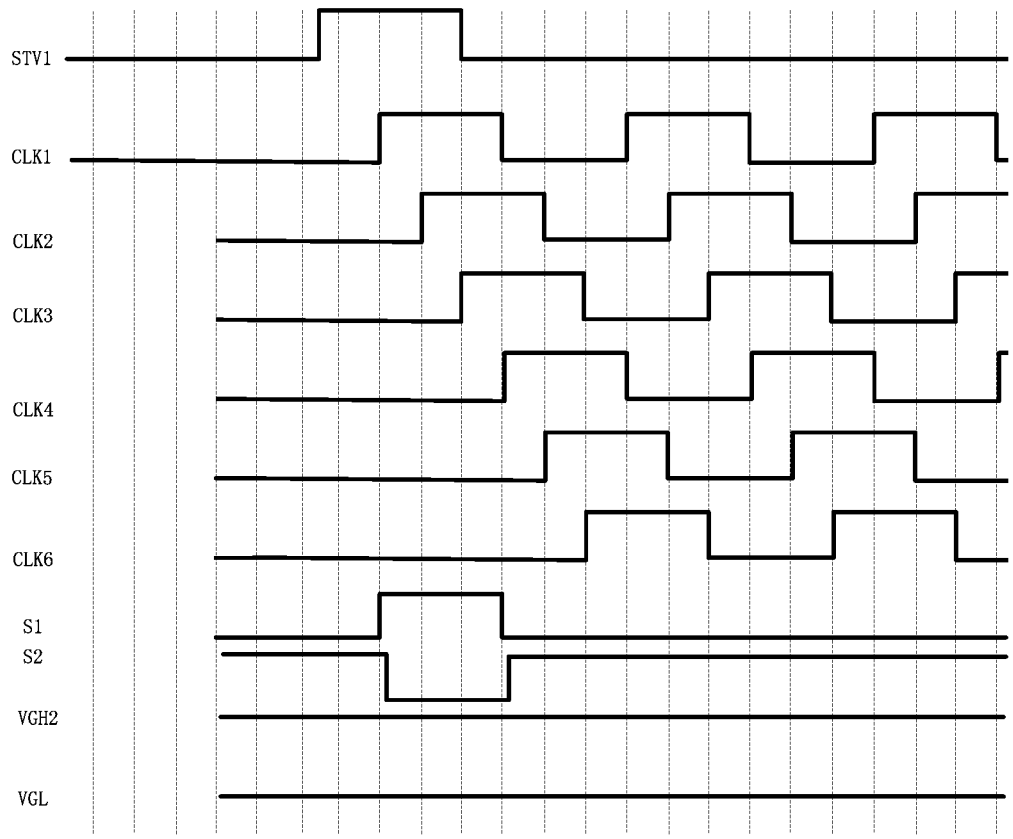
FIG. 5 is a timing diagram of a group of gate driving units according to some embodiments of the present disclosure.

FIG. 5 is a timing diagram of a group of gate driving units according to some embodiments of the present disclosure. As shown in FIG. 5, the clock signals of the first to sixth gate driving units in each group of gate driving units are CLK1, CLK2, CLK3, CLK4, CLK5, and CLK6, respectively, the signal of the gate driving signal terminal VGH2 is at a high level, and the signal of VGL is at a low level. The signal of the signal input terminal STV1 is taken as the input signal of the first three stages of gate driving units, and except the first three stages of gate driving units, the first output terminal OUT_c of the N-stage gate driving unit outputs a clock signal to the signal input terminal of the (N+3)-stage gate driving unit. Except the last four stages of gate drive units, the first output terminal OUT_c of the (N+4)-stage gate driving unit outputs a clock signal to the reset terminal of the N-stage gate driving unit.

Figure 6:
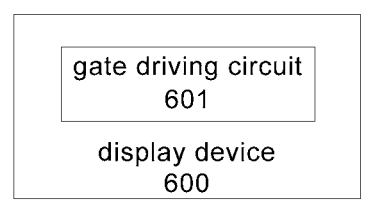
FIG. 6 is a schematic structural view showing a display device according to some embodiments of the present disclosure.

FIG. 6 is a schematic structural view showing a display device according to some embodiments of the present disclosure. As shown in FIG. 6, the display device 600 may comprise the gate driving circuit 601 of any one of the above embodiments. As some implementations, the display device 600 can be any product or component having a display function, such as a mobile phone, a tablet computer, a television, a display, a notebook computer, a digital photo frame, or a navigator. The display device 600 may further comprise a source driving circuit, gate lines, data lines, etc.

The present disclosure also provides a driving method for a gate driving circuit according to any one of the foregoing embodiments.

Figure 7:
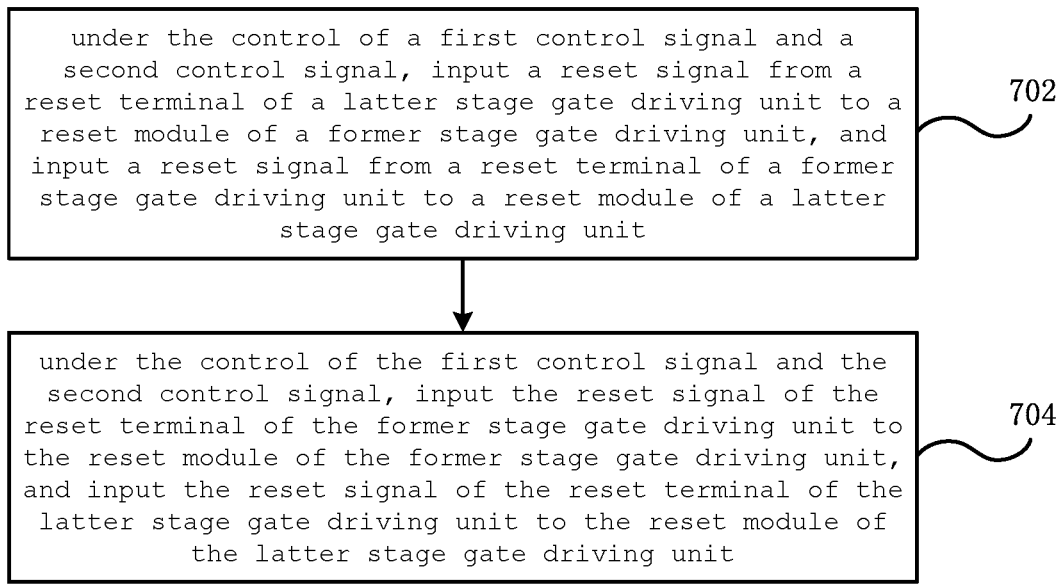
FIG. 7 is a schematic flow chart illustrating a driving method of the gate driving circuit according to some embodiments of the present disclosure.

FIG. 7 is a schematic flow chart illustrating a driving method of the gate driving circuit according to some embodiments of the present disclosure.

As shown in FIG. 7, the driving method may comprise step 702: under the control of a first control signal and a second control signal, inputting a reset signal from a reset terminal of a latter stage gate driving unit to a reset module of a former stage gate driving unit, and inputting a reset signal from a reset terminal of a former stage gate driving unit to a reset module of a latter stage gate driving unit, so as to achieving shifting output of gate driving signals. Herein, the former stage gate driving unit and the latter stage gate driving unit are two cascaded gate driving units.

In some embodiments, the driving method may further comprise step 704: under the control of the first control signal and the second control signal, inputting the reset signal of the reset terminal of the former stage gate driving unit to the reset module of the former stage gate driving unit, and inputting the reset signal of the reset terminal of the latter stage gate driving unit to the reset module of the latter stage gate driving unit, so as to achieving normal output of gate driving signals.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A gate driving circuit, comprising:
cascaded multistage gate driving units, wherein each stage of the gate driving units comprises:
a pull-up module for pulling up a potential of a pull-up node under the control of an input signal;
a first output module for pulling up the potential of the pull-up node under the control of a clock signal and outputting the clock signal to a first output terminal;
a second output module for outputting a gate driving signal to a second output terminal in a case where the potential of the pull-up node is pulled up by the first output module; and
a reset module for pulling down potentials of the pull-up node, the first output terminal and the second output terminal under the control of a reset signal from a reset terminal; and
a reset adjustment unit for, under the control of a first control signal and a second control signal, inputting the reset signal of the reset terminal of a former stage gate driving unit to the reset module of a latter stage gate driving unit, and inputting the reset signal of the reset terminal of the latter stage gate driving unit to the reset module of the former stage gate driving unit, wherein the former stage gate driving unit and the latter stage gate driving unit are two cascaded gate driving units of the gate driving units.

2. The gate driving circuit according to claim 1, wherein the reset adjustment unit is further used for, under the control of the first control signal and the second control signal, inputting the reset signal of the reset terminal of the former stage gate driving unit to the reset module of the former stage gate driving unit, and inputting the reset signal of the reset terminal of the latter stage gate driving unit to the reset module of the latter stage gate driving unit.

3. The gate driving circuit according to claim 1, wherein the reset adjustment unit comprises:
a first transistor, of which a gate electrode is used for receiving the first control signal, a first electrode is connected to the reset terminal of the former stage gate driving unit, and a second electrode is connected to the reset module of the latter stage gate driving unit;
a second transistor, of which a gate electrode is used for receiving the first control signal, a first electrode is connected to the reset terminal of the latter stage gate driving unit, and a second electrode is connected to the reset module of the former stage gate driving unit;
a third transistor, of which a gate electrode is used for receiving the second control signal, a first electrode is connected to the reset terminal of the former stage gate driving unit, and a second electrode is connected to the reset module of the former stage gate driving unit; and a fourth transistor, of which a gate electrode is used for receiving the second control signal, a first electrode is connected to the reset terminal of the latter stage gate driving unit, and a second electrode is connected to the reset module of the latter stage gate driving unit.

4. The gate driving circuit according to claim 3, wherein:
channels of the first transistor, the second transistor, the third transistor, and the fourth transistor have the same conductivity type; and
the first control signal and the second control signal have opposite logic levels.

5. The gate driving circuit according to claim 3, wherein:
channels of the first transistor and the second transistor have a first conductivity type, and channels of the third transistor and the fourth transistor have a second conductivity type different from the first conductivity type; and
the first control signal and the second control signal have the same logic level.

6. The gate driving circuit according to claim 5, wherein the first control signal is the same as the second control signal.

7. The gate driving circuit according to claim 1, wherein the pull-up module comprises:
a fifth transistor, of which a gate electrode is used for receiving the input signal, a first electrode is connected to a first voltage terminal, and a second electrode is connected to the pull-up node.

8. The gate driving circuit according to claim 1, wherein the first output module comprises:
a sixth transistor, of which a gate electrode is connected to the pull-up node, a first electrode is used for receiving the clock signal, and a second electrode is connected to the first output terminal; and
a capacitor, of which a first end of the capacitor is connected to the pull-up node, and a second end of the capacitor is connected to the first output terminal.

9. The gate driving circuit according to claim 1, wherein the second output module comprises:
a seventh transistor, of which a gate electrode is connected to the pull-up node, a first electrode is used for receiving the gate driving signal, and a second electrode is connected to the second output terminal.

10. The gate driving circuit according to claim 1, wherein the reset module comprises:
a eighth transistor, of which a gate electrode is connected to the reset adjustment unit, a first electrode is connected to the pull-up node, and a second electrode is connected to a second voltage terminal; and
a ninth transistor, of which a gate electrode is connected to the reset adjustment unit, a first electrode is connected to the second output terminal, and a second electrode is connected to the second voltage terminal.

11. The gate driving circuit according to claim 10, wherein the reset module further comprises:
a first control submodule for pulling up a potential of a first pull-down node in a case where the potential of the pull-up node is pulled down; and
a first holding submodule for pulling down potentials of the pull-up node, the first output terminal and the second output terminal in a case where the potential of the first pull-down node is pulled up.

12. The gate driving circuit according to claim 11, wherein the reset module further comprises:
a second control submodule for pulling up a potential of a second pull-down node in a case where the potential of the pull-up node is pulled down; and
a second holding submodule for pulling down potentials of the pull-up node, the first output terminal and the second output terminal in a case where the potential of the second pull-down node is pulled up.

13. A display device, comprising: the gate driving circuit according to claim 1.

14. A driving method for a gate driving circuit, wherein the gate driving circuit comprises:
cascaded multistage gate driving units, wherein each stage of the gate driving units comprises:
a pull-up module for pulling up a potential of a pull-up node under the control of an input signal;
a first output module for pulling up the potential of the pull-up node under the control of a clock signal and outputting the clock signal to a first output terminal;
a second output module for outputting a gate driving signal to a second output terminal in a case where the potential of the pull-up node is pulled up by the first output module; and
a reset module for pulling down potentials of the pull-up node, the first output terminal and the second output terminal under the control of a reset signal from a reset terminal; and
a reset adjustment unit for, under the control of a first control signal and a second control signal, inputting the reset signal of the reset terminal of a former stage gate driving unit to the reset module of a latter stage gate driving unit, and inputting the reset signal of the reset terminal of the latter stage gate driving unit to the reset module of the former stage gate driving unit, wherein the former stage gate driving unit and the latter stage gate driving unit are two cascaded gate driving units of the gate driving units;
the driving method comprises:
under the control of the first control signal and the second control signal, inputting the reset signal from the reset terminal of the former stage gate driving unit to the reset module of the latter stage gate driving unit, and inputting the reset signal from the reset terminal of the latter stage gate driving unit to the reset module of the former stage gate driving unit.

15. The driving method according to claim 14, further comprising:
under the control of the first control signal and the second control signal, inputting the reset signal of the reset terminal of the former stage gate driving unit to the reset module of the former stage gate driving unit, and inputting the reset signal of the reset terminal of the latter stage gate driving unit to the reset module of the latter stage gate driving unit.

16. The driving method according to claim 14, wherein the reset adjustment unit comprises:
a first transistor, of which a gate electrode is used for receiving the first control signal, a first electrode is connected to the reset terminal of the former stage gate driving unit, and a second electrode is connected to the reset module of the latter stage gate driving unit;
a second transistor, of which a gate electrode is used for receiving the first control signal, a first electrode is connected to the reset terminal of the latter stage gate driving unit, and a second electrode is connected to the reset module of the former stage gate driving unit;
a third transistor, of which a gate electrode is used for receiving the second control signal, a first electrode is connected to the reset terminal of the former stage gate driving unit, and a second electrode is connected to the reset module of the former stage gate driving unit; and a fourth transistor, of which a gate electrode is used for receiving the second control signal, a first electrode is connected to the reset terminal of the latter stage gate driving unit, and a second electrode is connected to the reset module of the latter stage gate driving unit.

17. The driving method according to claim 16, wherein:

channels of the first transistor, the second transistor, the third transistor, and the fourth transistor have the same conductivity type; and the first control signal and the second control signal have opposite logic levels.

18. The driving method according to claim 16, wherein:

channels of the first transistor and the second transistor have a first conductivity type, and channels of the third transistor and the fourth transistor have a second conductivity type different from the first conductivity type; and the first control signal and the second control signal have the same logic level.

19. The driving method according to claim 18, wherein the first control signal is the same as the second control signal.

* * * * *